US006624086B1

(12) United States Patent
Eissa

(10) Patent No.: US 6,624,086 B1
(45) Date of Patent: Sep. 23, 2003

(54) EFFECTIVE SOLUTION AND PROCESS TO WET-ETCH METAL-ALLOY FILMS IN SEMICONDUCTOR PROCESSING

(75) Inventor: Mona M. Eissa, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/640,250

(22) Filed: Aug. 16, 2000

Related U.S. Application Data

(60) Provisional application No. 60/154,082, filed on Sep. 15, 1999.

(51) Int. Cl.$^7$ .............................................. H01L 21/302
(52) U.S. Cl. ............................ 438/745; 438/754; 134/3
(58) Field of Search ................................ 438/745, 754, 438/756, 757; 134/1.3, 3

(56) References Cited

U.S. PATENT DOCUMENTS

| | | | | |
|---|---|---|---|---|
| 5,523,593 A | * | 6/1996 | Kagaya et al. ............... | 257/192 |
| 5,798,540 A | * | 8/1998 | Boos et al. .................. | 257/194 |
| 5,896,875 A | * | 4/1999 | Yoneda ...................... | 134/100.1 |
| 6,149,828 A | * | 11/2000 | Vaartstra ....................... | 216/57 |
| 6,162,671 A | * | 12/2000 | Lee et al. ................. | 361/321.4 |
| 6,232,228 B1 | * | 5/2001 | Kwag et al. ................. | 438/669 |
| 6,326,317 B1 | * | 12/2001 | Wang et al. ................. | 438/300 |

FOREIGN PATENT DOCUMENTS

| | | |
|---|---|---|
| JP | 61-269804 | 11/1986 |
| JP | 02186614 A | 7/1990 |
| JP | 09153598 A | 10/1997 |

* cited by examiner

*Primary Examiner*—Kin-Chan Chen
(74) *Attorney, Agent, or Firm*—Peter K. McLarty; W. James Brady, III; Frederick J. Telecky, Jr.

(57) ABSTRACT

A solution and method is described for etching TaN, TiN, Cu, FSG, TEOS, and SiN on a silicon substrate in silicon device processing. The solution is formed by combining HF at 49% concentration with $H_2O_2$ at 29%–30% concentration in deionized water.

7 Claims, No Drawings

EFFECTIVE SOLUTION AND PROCESS TO WET-ETCH METAL-ALLOY FILMS IN SEMICONDUCTOR PROCESSING

This application claims priority under 35 USC §119(e)(1) of provisional application No. 60/154,082 filed Sep. 15, 1999.

FIELD OF THE INVENTION

The present invention relates to a wet chemical etch process for etching fluorinated silicon oxide, TEOS, TiN, TaN, SiN, and copper films in semiconductor processing without damaging the silicon substrate surface. The wet chemical etching process leaves the silicon surface hydrophilic. The process uses a mixture of $H_2O_2$ and HF in de-ionized water.

BACKGROUND OF THE INVENTION

In the fabrication of an integrated circuit on a silicon substrate a number of metal alloy layers are formed. Titanium nitride (TiN) films are used as barrier layers for aluminum metal lines. These barriers layers are necessary to prevent the unwanted chemical interaction of the aluminum metal lines with other layers in the circuit. Currently, hot concentrated sulfuric acid and hydrogen peroxide or a hot $SC_2$ ($HCl+H_2O_2+DIW$) solution is used to wet etch TiN films. Both of these solutions will attach the Silicon substrate leading to a roughening of the surface or the creation of voids. With the advent of the use of copper metal lines, tantalum nitride (TaN) films are finding increasing use as barrier layers for copper films. These TaN films often act as diffusion barriers preventing the diffusion of copper from the metal lines into other parts of the circuit where it would inhibit proper circuit operation. There is not a suitable wet etch process for removing TaN films from a silicon substrate. In addition, it is often necessary to etch these copper film in the presence of a patterned photoresist. Copper can be etched using a hot concentrated sulfuric acid or a hot $SC_2$ ($HCl+H_2O_2+DIW$) solution. These solutions will attack the photoresist films in current use and therefore cannot be used in the presence of photoresist films. Silicon nitride (SiN) films are used extensively in the fabrication of integrated circuits both as part of the transistor structure and as a barrier layer or liner layers. Current techniques to remove SiN involve the use of phosphoric acid at temperatures as high as 160° C. As in the case of hot sulfuric acid, hot phosphoric acid will attack the silicon substrate. Fluorinated silicon dioxide (FSG) and TEOS are typically etched using HF solutions which can in some instances attack the silicon substrate. In each instance of the above discussed materials/metal-alloys it will be necessary to remove these layers from the silicon substrate without producing damage to the surface. This need might arise during the reworking of a silicon wafer through a particular processing sequence involving one of the above mentioned films. Reworking of a silicon wafer through a processing sequence is often necessary due to mis-processing of the wafer during the sequence. A need therefore exists for a wet chemical process that effectively and completely removes TaN, TiN, SiN, Cu, FSG, and TEOS from the surface of a silicon substrate without damaging said surface.

SUMMARY OF INVENTION

The instant invention is a process to wet-etch TaN, TiN, SiN, Cu, FSG, and/or TEOS films. Solutions of hydrofluoric acid (HF) and hydrogen peroxide ($H_2O_2$) are used for the wet etch. De-ionized water is used to dilute all the solutions used and will be represented by the symbol DIW. In all solutions of the instant invention, the presence of $H_2O_2$ in the solution will leave the silicon substrate surface hydrophillic. This will reduce the number of particles left on the surface after the chemical process. In addition, the solutions described will not attack photoresist. This allows the above mentioned films to be etched in the presence of patterned photoresist.

The $HF:H_2O_2:DIW$ solution provides a wet chemical process to remove TaN without damaging the silicon substrate. In addition it will not attack photoresist and therefore can be used in a process involving patterned photoresist. In addition, the solution will etch SiN, TiN, FSG, TEOS and Cu either singly or simultaneous along with TaN without damaging the silicon substrate.

DETAILED DESCRIPTION OF THE INVENTION

It is often necessary to remove TiN, TaN, SiN, Cu, FSG and/or TEOS from a silicon substrate without damaging the surface of said substrate. The instant invention describes a wet chemical etch method for the removal of such films from a silicon substrate. For all the chemical solution examples described herein, it should be assumed that the hydroflouric acid (HF) used has a 49% concentration (24.5 moles/L) and the hydrogen peroxide ($H_2O_2$) used has a 29%–30% concentration (8.8 moles/L). In an embodiment of the instant invention, HF with a concentration of 49% and $H_2O_2$ with a concentration of 29%–30% is mixed together and diluted in deionized water to specific volume rations for etching TaN, TiN, SiN, Cu, TEOS, and FSG. TEOS is used to represent silicon oxide formed by the pyrolysis of the alkoxy compound tetraethoxysilane.

An embodiment of the wet chemical etch solution is a volume ratio of 2:1:21 of $HF:H_2O_2:DIW$. For most applications in the processing of semiconductor integrated circuits, this volume ratio will result in reasonable etch rates for TaN. In addition to etching TaN without damaging the silicon substrate, the 2:1:21 solution will simultaneously etch all the above compounds with a selectivity of FSG>TEOS>CU>SiN>TiN>TaN. Changing the volume ratios of HF and H2O2 will affect the etch rate of each material but the overall trend in etch rate selectivity will remain unchanged. It should be noted that the 2:1:21 (HF:H2O2:DIW) solution is effective at room temperature and should be used at such. It can however be used at temperatures greater than room temperature. This solution and all solutions described in the instant invention can be used by immersing the silicon substrate in the solution as part of a batch type process or by spraying the solution unto the surface of each wafer.

Another embodiment of the wet chemical etch solution is a volume ratio of 3:2:10 of $HF:H_2O_2:DIW$ and a third embodiment is a volume ratio of 3:1:10 of $HF:H_2O_2:DIW$. In general, the more concentrated the solution the faster the reaction rate.

For the etching of TaN, the lowest volume ratio (ie., volume:volume:volume)of $HF:H_2O_2:DIW$ that can be practically used is 1:1:20. However, SiN, TiN, FSG, TEOS and Cu can be removed with a minimum volume ratio of 1:1:30 of $HF:H_2O_2:DIW$. More concentrated solutions of the $HF:H_2O_2$ solution can be used with a change in the etch rates for the above mentioned materials/metal-alloys. In all embodiments, use of a higher temperature such as 40° C. to 50° C. will increase the reaction rate of the solutions to TiN, TaN, SiN, Cu, Al while all FSG type oxides remain relatively unchanged.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A solution for etching TaN during semiconductor device processing, consisting essentially of combining HF with a concentration of 49% with $H_2O_2$ with a concentration of 29%–30% in deionized water wherein said solution has a volume ratio greater than 1:1:20 of HF:$H_2O_2$:deionized water.

2. A solution for etching TaN during semiconductor device processing, consisting essentially of combining HF with a concentration of 49% with $H_2O_2$ with a concentration of 29%–30% in deionized water wherein said solution has a volume ratio of 2:1:21 of HF:$H_2O_2$:deionized water.

3. A solution for etching TaN during semiconductor device processing, consisting essentially of combining HF with a concentration of 49% with $H_2O_2$ with a concentration of 29%–30% in deionized water wherein said solution has a volume ratio of 3:2:10 of HF:$H_2O_2$:deionized water.

4. A solution for etching TaN during semiconductor device processing, consisting essentially of combining HF with a concentration of 49% with $H_2O_2$ with a concentration of 29%–30% in deionized water wherein said solution has a volume ratio of 3:1:10 of HF:$H_2O_2$:deionized water.

5. A solution for etching TaN, TiN, Cu, FSG, TEOS, and SiN in silicon device processing, consisting essentially of combining HF with a concentration of 49% with $H_2O_2$ with a concentration of 29%–30% in deionized water from 40° C. to 50° C. wherein said solution has a volume ratio of 2:1:21 of HF:$H_2O_2$:deionized water.

6. A solution for etching TaN, TiN, Cu, FSG, TEOS, and SiN in silicon device processing, consisting essentially of combining HF with a concentration of 49% with $H_2O_2$ with a concentration of 29%–30% in deionized water from 40° C. to 50° C. wherein said solution has a volume ratio of 3:2:10 of HF:$H_2O_2$:deionized water.

7. A solution for etching TaN, TiN, Cu, FSG, TEOS, and SiN in silicon device processing, consisting essentially of combining HF with a concentration of 49% with $H_2O_2$ with a concentration of 29%–30% in deionized water from 40° C. to 50° C. wherein said solution has a volume ratio of 3:1:10 of HF:$H_2O_2$:deionized water.

* * * * *